US00RE36046E

United States Patent [19]

Brambilla et al.

[11] E Patent Number: Re. 36,046

[45] Reissued Date of Patent: Jan. 19, 1999

[54] DRIVE CIRCUIT FOR INDUCTIVE LOADS, PARTICULARLY FOR FUEL INJECTORS

[75] Inventors: Massimiliano Brambilla, Milan; Giampietro Maggioni, Cornaredo, both of Italy

[73] Assignee: SGS-Thomson Microelectronics, S.r.l., Agrate Brianza, Italy

[21] Appl. No.: 699,879

[22] Filed: Aug. 23, 1996

Related U.S. Patent Documents

Reissue of:

[64] Patent No.: 5,341,032
Issued: Aug. 23, 1994
Appl. No.: 14,051
Filed: Feb. 5, 1993

U.S. Applications:

[63] Continuation of Ser. No. 810,950, Dec. 19, 1991, abandoned.

[30] Foreign Application Priority Data

Dec. 21, 1990 [IT] Italy ..... 68037A90

[51] Int. Cl.[6] ..... H03K 3/00; F02M 51/00; H01H 9/00

[52] U.S. Cl. ..... 327/108; 327/110; 123/490; 361/154

[58] Field of Search ..... 327/108, 110; 123/490; 361/154

[56] References Cited

U.S. PATENT DOCUMENTS

| | | | |
|---|---|---|---|
| 4,238,813 | 12/1980 | Carp et al. | 361/154 |
| 4,292,948 | 10/1981 | Graessley | 123/490 |
| 4,327,394 | 4/1982 | Harper | 361/154 |
| 4,358,812 | 11/1982 | LoCascio et al. | 361/152 |
| 4,612,597 | 9/1986 | Hamren | 361/152 |
| 5,072,141 | 12/1991 | Eisenbart et al. | 307/571 |

FOREIGN PATENT DOCUMENTS

| | | | |
|---|---|---|---|
| 0 288 015 | 10/1988 | European Pat. Off. | H02M 3/156 |
| 0 319 669 | 6/1989 | European Pat. Off. | H02M 3/158 |
| 62-290111 | 12/1987 | Japan . | |

*Primary Examiner*—David C. Nelms
*Assistant Examiner*—Trong Phan
*Attorney, Agent, or Firm*—David V. Carlson; Bryan A. Santarelli; Seed and Berry LLP

[57] ABSTRACT

[A circuit comprising a switch series connected to a load; a first and second current recirculating branch alternately connectable parallel to the load, for reducing the current in the same; and a logic control unit for opening and closing the switch and recirculating branches, so that the load is supplied with a current rising to a peak value and then falling rapidly to and oscillating about a lower hold value; a transistor being provided for reducing the voltage supplied to the load by the first recirculating branch at the end of the fast fall phase, so as to eliminate uncontrollable operating zones and prevent the load current from falling below the hold value.]

*A device for driving an inductive load such as a fuel injector includes a drive switch and a voltage regulator that are coupled to the inductive load. The device also includes a control circuit that is coupled to the voltage regulator, the drive switch, and the inductive load. The control circuit receives a drive signal and in response to the drive signal controls the voltage regulator and the drive switch. Initially, the switch closes and draws a charge current through the inductive load. When the charge current reaches a peak level, the switch opens to allow a discharge current to flow through the inductive load. The voltage regulator regulates the discharge voltage across the inductive load such that the discharge current falls at a first rate. When the discharge current reaches a first value, the voltage regulator regulates the discharge voltage across the inductive load so as to decrease the rate at which the discharge current falls. When the discharge reaches a second value, the control circuit controls the drive switch to generate a hold current through the inductive load.*

42 Claims, 2 Drawing Sheets

DRIVE CIRCUIT FOR INDUCTIVE LOADS, PARTICULARLY FOR FUEL INJECTORS

Matter enclosed in heavy brackets [ ] appears in the original patent but forms no part of this reissue specification; matter printed in italics indicates the additions made by reissue.

This is a continuation of application Ser. No. 07/810,950 filed Dec. 19, 1991, now abandoned.

BACKGROUND OF THE INVENTION

The present invention relates to an inductive load drive circuit, particularly for fuel injectors.

On automotive electronic injection systems, fuel supply is enabled by means of an electronically controlled valve, operation of which is controlled by the magnetic field produced by an electromagnet roughly describable as an inductor wound about a core and through which a control current is supplied.

To reduce dissipation, control is effected in two phases: a first phase requiring a strong magnetic field for opening the valve (peak phase); and a second phase in which the valve is kept open (hold phase), and in which a lower magnetic field and, consequently, a lower control current are required.

FIG. 2 shows a rough half line graph of the control current $I_L$ of an injector. As can be seen, the peak phase extends up to instant $t_1$, with current $I_L$increasing up to a maximum value $I_p$. This is followed by phase $t_1$–$t_2$ in which the current falls sharply, depending on application requirements; an uncontrollable phase $t_2$–$t_3$; and, from $t_3$ onwards, the actual hold phase, chopped to prevent active elements in a linear zone resulting in dissipation.

The passage from peak current $I_p$ to the hold current (ranging between a maximum $I_{HMAX}$ and a minimum $I_{HMIN}$) must be effected rapidly, for which purpose provision is made for recirculating high voltage current (freewheeling zone), i.e. to reduce the current in the inductor, this is supplied with a high voltage for forcing a fall in current.

The high speed required in passing from the peak to the hold current results in magnetic problems, the effect of which is to create a zone (interval $t_2$–$t_3$ in FIG. 2) that is hard to control.

As the presence of uncontrollable zones may result, in some cases, in malfunctioning or at any rate in impaired reliability of the circuit, such zones must perforce be eliminated. One known method of doing this is to maintain the high speed recirculating or free-wheeling phase until the current in the load drops to a so-called "undershoot" value, lower than that of the hold current, and to only subsequently commence the hold phase. The corresponding current pattern in the inductor is as shown in FIG. 3, wherein the recirculating phase is maintained up to instant $t_4$, at which point the recirculating current reaches the undershoot value $I_{UND}$, marking the start of the hold phase in which the current in the inductor oscillates between $I_{HMAX}$ and $I_{HMIN}$ as in FIG. 2.

The above solution, however, is also unsatisfactory, in that it requires a highly accurate $I_{UND}$ value at which to arrest the high speed recirculating phase, to prevent too low a current value, and consequently too low a magnetic field, from closing the valve. The attainment of a sufficiently high degree of accuracy inevitably results in difficulties (again affecting the reliability of the circuit) or at any rate in complex design and high manufacturing cost of the circuit.

SUMMARY OF THE INVENTION

It is an object of the present invention to provide a drive circuit of the type described above, designed to eliminate the presence of uncontrollable zones without reducing the control current below the hold value, thus safeguarding against undesired closure of the valve, and providing for maximum reliability, straightforward design and low-cost manufacture of the circuit.

According to the present invention, there is provided an inductive load drive circuit, particularly for fuel injectors, as claimed in claim 1.

The present invention is based on maintaining the high speed recirculating phase until a value close to the hold value range is reached, thus preventing it from falling below the minimum hold value, and in subsequently forcing a slower reduction to the minimum hold value. The follow-up current reduction phase is effected by the same branch as the high speed recirculating phase, and is controlled accurately so that the high speed recirculating branch applies a predetermined recirculating voltage, lower than that of the high speed recirculating phase.

BRIEF DESCRIPTION OF THE DRAWINGS

A preferred non-limiting embodiment of the present invention will be described by way of example with reference to the accompanying drawings, in which.

DETAILED DESCRIPTION OF THE INVENTION

Figure 1:
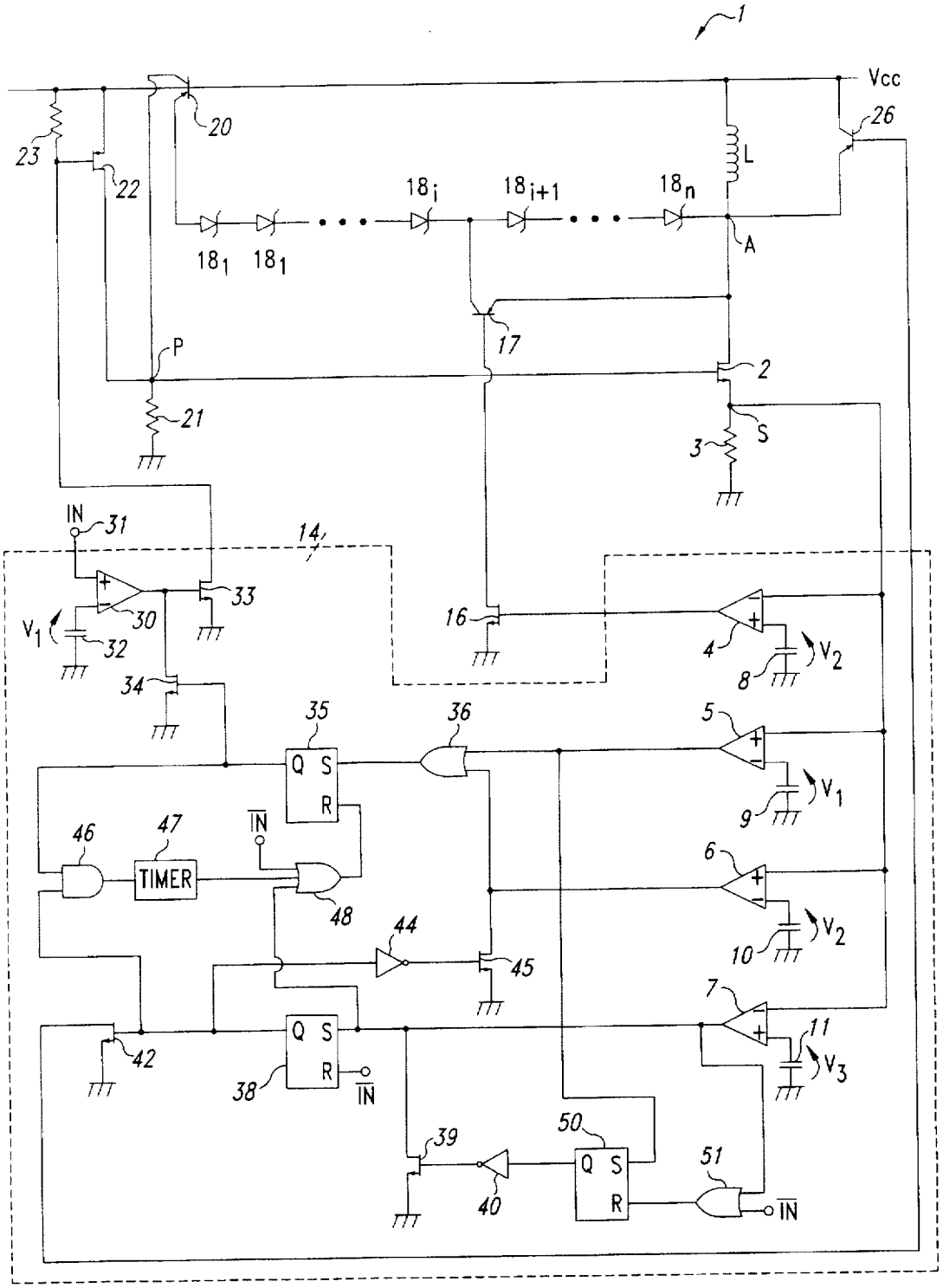
FIG. 1 shows an operating block diagram of the circuit according to the present invention.
Figure 2:
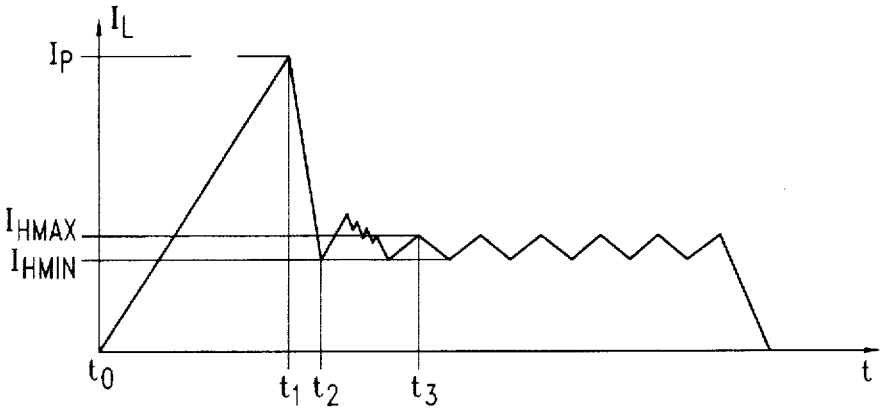
Fig. 2 (PRIOR ART)
FIG. 2 shows a current graph relative to a known circuit.
Figure 3:
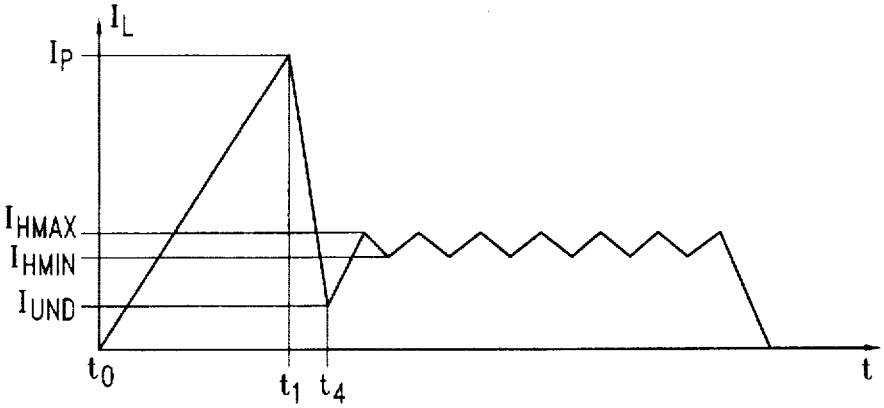
Fig. 3 (PRIOR ART)
FIG. 3 shows a current graph relative to a further known circuit.

In FIG. 1, the electromagnet controlling the valve on the injector is shown schematically by inductor L, which also represents the load of control circuit 1 according to the present invention.

Inductor L is connected between a supply line $V_{CC}$, constituting a first reference potential line, and point A, which is grounded (constituting a second reference potential line) via a controlled power switch 2 consisting, in this case, of a DMOS transistor, and a sensing resistor 3. The mid point S between transistor 2 and resistor 3 is connected to a first input of four comparators 4, 5, 6, 7 forming part of a logic control unit 14. That is, point S is connected to the inverting inputs of comparators 4 and 7, and to the non-inverting inputs of comparators 5 and 6, while the non-inverting inputs of comparators 4 and 7 are connected respectively to reference voltage sources 8 and 11, and the inverting inputs of comparators 5 and 6 to respective sources 9 and 10. Source 9 supplies a voltage $V_1$ equal to that at the terminals of resistor 3 when supplied with current $I_p$; sources 8 and 10 supply a voltage $V_2$ corresponding to current $I_{HMAX}$; and source 11 supplies a voltage $V_3$corresponding to current $I_{HMIN}$.

The output of comparator 4 is connected to a MOS control transistor 16, the source terminal of which is grounded, and the drain terminal of which is connected to the base of a PNP transistor 17, the emitter of which is connected to point A, and the collector of which is connected to the mid point of a series of Zener diodes $\mathbf{18}_1$, $\mathbf{18}_2$, . . . , $\mathbf{18}_i$, $\mathbf{18}_{i+1}$, . . . , $\mathbf{18}_n$. Diodes 18 are connected in the same direction, with the cathode of diode $\mathbf{18}_n$ connected to point A, and the anode of diode $\mathbf{18}_1$ series connected to the emitter of a PNP transistor 20. Transistor 20 presents its base connected to supply line $V_{CC}$, and its collector connected to a point P connected directly to the control terminal of switch 2, and grounded via resistor 21. Point P is also connected to the drain terminal of a MOS P channel transistor 22, the source terminal of which is connected to supply line $V_{CC}$, and the gate terminal of which is connected to an output of logic control unit 14 and, via resistor 23, to the supply line.

Logic unit 14 presents a further output connected to the base terminal of a recirculating PNP transistor 26, the collector of which is connected to the supply line, and the emitter to point A.

In addition to comparators 4–7, logic unit 14 also comprises an input comparator 30 having its non-inverting input connected to input terminal 31 of circuit 1 and receiving injection control signal IN; and its inverting input connected to a source 32 supplying a reference voltage $V_4$. The output of comparator 30 drives a MOS control transistor 33 having its source terminal grounded, and its drain terminal connected to the gate of transistor 22. The output of comparator 30 is also connected to the drain terminal of a further MOS transistor 34, the source terminal of which is grounded, and the gate terminal of which is connected to output Q of a storage element or flip-flop 35. Flip-flop 35 presents an input S connected to the output of an OR circuit 36 having two inputs connected respectively to the outputs of comparators 5 and 6.

The output of comparator 7 is connected to the set input S of a second flip-flop 38 and to the drain terminal of a MOS transistor 39, the source terminal of which is grounded, the gate terminal of which is connected, via inverter 40, to output Q of a further flip-flop 50. Flip-flop 50 presents its set input S connected to the output of comparator 5, and its reset input R connected to the output of an OR circuit 51, one input of which is connected to the output of comparator 7, and the other input of which receives the inverted value of injection control signal $\overline{IN}$. Reset input R of flip-flop 38 is connected to the inverted value of injection control signal $\overline{IN}$, while output Q is connected to the gate terminal of a MOS transistor 42, the source terminal of which is grounded, and the drain terminal of which is connected to the base of recirculating transistor 26. The output of flip-flop 38 is also connected, via inverter 44, to the gate terminal of a MOS transistor 45, the source terminal of which is grounded, and the drain terminal of which is connected to the output of comparator 6.

Output Q of flip-flop 38 is also connected to a first input of an AND circuit 46, the other input of which is connected to the output Q of flip-flop 35. Via a delay element or timer 47, e.g. capacitive type, the output of circuit 46 is connected to one input of an OR circuit 48 having a second input receiving the inverted value of injection control signal $\overline{IN}$, and a third input connected to the output of comparator 7. Finally, the output of OR circuit 48 is connected to the reset input of flip-flop 35.

Figure 4:
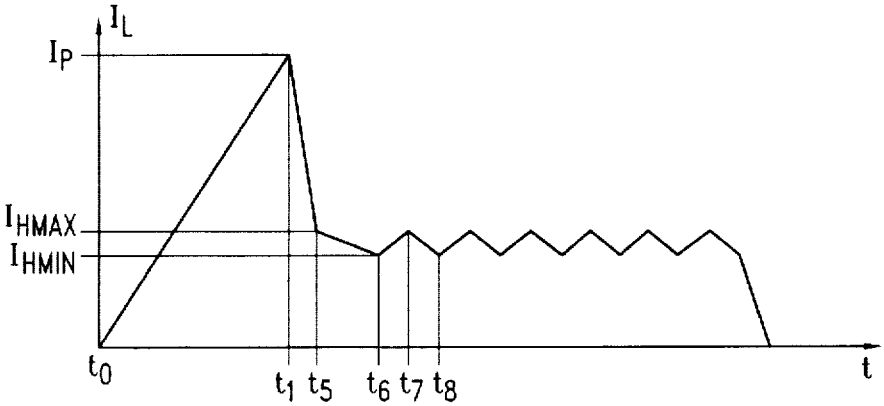
Fig. 4 (PRIOR ART)
FIG. 4 shows a current graph relative to the FIG. 1 circuit according to the present invention.

Operation of circuit 1 will be described with reference to FIG. 4. At the start, when signal IN is low, flip-flop 38 and, via circuit 48, flip-flop 35 are reset, so that output Q is also low. Similarly, flip-flop 50 is reset via circuit 51, so that its output is low, thus switching on transistor 39, which maintains a low output of comparator 7. Also, the output of comparator 30 is low, switch 2 is open, and no current flows through L.

As soon as signal IN switches to high (instant $t_0$), comparator 30 switches, so as to switch on transistor 33, and consequently transistor 22, and close switch 2. Inductor L is thus connected between supply $V_{CC}$ and ground, and begins conducting an increasing current. Initially (as long as the voltage drop of resistor 3 is less than $V_2$) comparator 4 supplies a high output signal, but the voltage drop at the base-emitter junction of transistor 17 is such that the transistor remains off. Moreover, the output of comparator 6 is kept low by activated transistor 45.

When the current in the inductor reaches the peak value $I_p$ (instant $t_1$), comparator 5 switches to high, thus switching flip-flop 35, which in turn turns on transistor 34, turns off transistors 33 and 22, and opens switch 2. Consequently, voltage $V_L$ at the terminals of inductor L rises rapidly to a value $V_{CL}$ equal to:

$$V_L=V_{CL}=V_{CC}+n*V_z+V_{BE20}$$

where $V_{BE20}$ is the base-emitter voltage drop of transistor 20; $V_z$ is the breakdown voltage of each Zener diode; and n the number of Zener diodes 18.

Switching of comparator 5 also switches flip-flop 50, which receives a high signal at input S and, via inverter 40, turns off transistor 39, thus releasing the output of comparator 7, which nevertheless remains low. When voltage $V_{CL}$ is reached, Zener diodes 18 and the base-emitter junction of transistor 20 are biased to such a value as to turn on transistor 20 in the active region and diodes 18 in the Zener zone. Transistor 20 therefore supplies the gate of transistor 2 with such a current as to again turn on (close) transistor 2. Resistor 21 in particular is so sized as to guarantee the bias current of Zener diodes 18 and transistor 20, while maintaining transistor 2 in the saturated zone and preventing a fall in voltage at point A, which would turn off Zener diodes 18 and, consequently, switch 2. The branch consisting of transistor 20 and diodes 18 locks the voltage at the terminals of inductor L to value $V_{CL}$, so that current $I_L$ falls steadily, as shown in FIG. 4 (interval $t_1$–$t_5$).

When current $I_L$ reaches the maximum hold value $I_{HMAX}$ at instant $t_5$, the output of comparator 4 switches to high, and turns on control transistor 16 and, consequently, transistor 17, which saturates. This therefore short-circuits diodes $18_{i+1}$–$18_n$ connected between the collector and the emitter, so as to reduce the voltage at the terminals of inductor L to a value for [$V_{CL}$equal] $V_{CL}$, *equal* to:

$$V_{CL}=V_{CC}+V_{BE20}+i*V_z+V_{CE17}$$

where "i" is the number of the on Zener diodes; and $V_{CE17}$ is the collector-emitter fall in voltage of transistor 17.

Inductor L therefore continues discharging, but less rapidly (and consequently less sharply). This phase lasts up to instant $t_6$, at which point, comparator 7, detecting voltage $V_3$ on resistor 3, i.e. corresponding to current value $I_{HMIN}$, switches to high, thus switching flip-flop 38. Output Q of flip-flop 38 therefore switches to high, which turns on transistor 42, thus enabling the recirculating circuit including PNP transistor 26, and turns off transistor 45, thus enabling the output of comparator 6, which nevertheless remains low. Via OR circuit 48, the high signal at the output of comparator 7 also resets flip-flop 35, the output Q of which switches to low, thus turning off transistor 34 and activating transistor 22 and switch 2, so that the current in inductor L rises. Finally, via circuit 51, the high signal at the output of comparator 7 resets flip-flop 50, which turns on transistor 39 for again maintaining a low output of comparator 7.

The current in the inductor therefore continues rising until it reaches value $I_{HMAX}$ (instant $t_7$), at which point, the output of comparator 6 switches to high, thus switching output Q of flip-flop 35 once more to high, and turning off transistors 33, 22 and switch 2. The opening of switch 2 again causes an increase in the voltage at point A, which, in this case, rises high enough to start PNP transistor 26. The current therefore decreases through transistor 26, but, as the voltage is not sufficient for turn on the recirculating branch including transistor 20 and diodes 18, and therefore closing switch 2, the recirculating current does not flow through resistor 3. The end of this phase is determined by the switching of timer 47, which, enabled by circuit 46 receiving two high input signals, after a given time period (that required for lowering current $I_L$ to roughly the $I_{HMIN}$ value) resets flip-flop 35, thus turning off transistor 34 and closing switch 2 (instant $t_8$).

The current in the inductor therefore increases once more, as following instant $t_6$, and the hold phase continues in this way, supplying the inductor with a hold current oscillating between $I_{HMAX}$ and $I_{HMIN}$, thus ensuring that the injector valve remains open.

The advantages of the FIG. 1 circuit according to the present invention will be clear from the foregoing description. By applying a predetermined recirculating voltage lower than that of the fast fall phase, immediately following the fast fall phase and commencing from a value higher than $I_{HMIN}$, the circuit according to the present invention provides for reducing the current in perfectly controlled manner, thus eliminating the uncontrollable zone, which would otherwise impair the reliability of the injector-control circuit system.

Moreover, by eliminating the undershooting phase, the circuit according to the present invention, which is both easy to produce and readily integratable, ensures against undesired closure of the valve.

Finally, the circuit according to the present invention provides for troublefree variation of the voltage in the settling or slower recirculating phase as a function of the load, by varying the number of short-circuited Zener diodes.

To those skilled in the art it will be clear that changes may be made to the circuit as described and illustrated herein without, however, departing from the scope of the present invention. In particular, logic unit 14 may be employed differently, providing switch 2 and the recirculating branches are so controlled as to produce the FIG. 4 pattern.

We claim:

1. An improved fuel injector drive circuit, said drive circuit having a switch series-connected to an inductive load, said load having first and second terminals;

a first current recirculating branch, having nodes connected to said first and second terminals of said load, for maintaining a predetermined load voltage and enabling a fall in load current at a first predetermined rate from a peak current and having a plurality of series-connected Zener diodes;

a second current recirculating branch parallel-connected to the load, for enabling a fall in load current at a second predetermined rate from a predetermined maximum hold current;

a logic control unit responsive to said load current for opening and closing said switch and said branches, so that the load is supplied with current rising to said peak current, and then falling at said first predetermined rate and oscillating between said predetermined maximum hold current and a predetermined minimum hold current; the improvement comprising means, connected to said first branch, for varying said predetermined load voltage supplied across the load to a lower predetermined load voltage when said load current reaches a predetermined amount from said peak current, said supplied voltage varying means having a transistor having emitter and collector terminals connected to said second terminal of the load and between a predetermined pair of connected Zener diodes, a base terminal of said transistor coupled to an output of a comparator having a first input connected to a reference voltage source, and a second input connected to a load current sensing element for short-circuiting a predetermined subset of said series-connected Zener diodes;

whereby said fall in load current from said peak current occurs at said first predetermined rate and is then slowed when said load current reaches said predetermined amount from said peak current.

2. A circuit for driving an inductive load, said circuit comprising a switch connected in series with said inductive load between first and second reference potential lines;

a first recirculating branch having a first node connected to said first reference potential line, and a second node connected between said switch and said inductive load, and having a means for generating a predetermined bias voltage across said load to enable a fall in current through said load after said current reaches a peak value;

a second recirculating branch connected between said switch and said first reference potential line in parallel with said inductive load, said second branch enabling a fall in current through said load;

a logic unit for controlling said switch and said branches so that said load is supplied with current rising to said peak value, and then falling to and oscillating about a lower hold value; and means connected to said first branch for decreasing said bias voltage across said load when said current through said load reaches said predetermined amount less than said peak value so that said fall in current [though] *through* said load is slowed after said current reaches a predetermined amount less than said peak value.

3. The circuit as in claim 2 wherein said first branch comprises a plurality of series-connected Zener diodes generating said predetermined bias voltage and said first branch bias voltage decreasing means comprises means for short-circuiting a subset of said Zener diodes to decrease said predetermined bias voltage.

4. The circuit as in claim 3 wherein said first recirculating branch comprises a transistor having a base terminal connected to said first node, an emitter terminal connected to said Zener diodes and a collector terminal connected to a third node of said first recirculating circuit, said third node connected to said second reference potential line.

5. The circuit as in claim 4 wherein said first recirculating branch comprises a resistive means connected between said collector terminal and said third node, said collector terminal further connected to said switch.

6. The circuit as in claim 3 wherein said short-circuiting means comprises a transistor having emitter and collector terminals connected between said load and said switch, and a predetermined pair of connected Zener diodes, a base terminal of said transistor connected to a second switch for turning on said transistor when said current through said load reaches said predetermined amount less than said peak value, said second switch connected to an output of a comparator having a first input connected to a reference voltage source, and a second input connected to a load current sensing element.

7. The circuit as in claim 6 wherein said inductive load comprises a fuel injector.

8. A circuit for driving an inductive load, said circuit comprising a switch connected in series with said inductive load between first and second reference potential lines;

a recirculating branch having a first node connected to said first reference potential line, and a second node connected between said switch and said inductive load, said branch having a plurality of series-connected Zener diodes generating said voltage across said load to enable a fall in load current through said load after said current reaches a peak value;

means, responsive to said load current and connected to said switch and to said first reference potential line in parallel to said load, for controlling said switch so that said load current oscillates between first and second hold values after said current falls from said peak value; and means, responsive to said controlling means and connected to said branch, for short-circuiting a subset of said Zener diodes to decrease said voltage across said load when said current through said load reaches a predetermined value after said current falls from said peak value;

whereby said fall in current through said load is slowed when said current reaches said predetermined value from said peak value.

9. The circuit as in claim 8 wherein said recirculating branch has a third node connected to said second reference potential line and a transistor having a base terminal connected to said first node, an emitter terminal connected to said Zener diodes and a collector terminal connected to a third node of said recirculating circuit, said third node connected to said second reference potential line.

10. The circuit as in claim 9 wherein said recirculating branch comprises a resistive means connected between said collector terminal and said third node, said collector terminal further connected to said switch.

11. The circuit as in claim 8 wherein said short-circuiting means comprises a transistor having emitter and collector terminals connected between said load and said switch, and between a predetermined pair of connected Zener diodes, a base terminal of said transistor connected to a second switch for turning on said transistor when said current through said load reaches said predetermined value, said second switch connected to an output of a comparator having a first input connected to a reference voltage source, and a second input connected to a load current sensing element.

12. The circuit as in claim 11 wherein said inductive load comprises a fuel injector.

*13. A device for controlling an electronic fuel injector that has a solenoid and a solenoid-controlled fuel valve, said solenoid having first and second terminals, said device comprising:*

*a first supply terminal coupled to said first terminal of said solenoid;*

*a second supply terminal;*

*a control circuit having an input terminal for receiving a fuel-injector control signal, a sensing input terminal, a first control output terminal, and a second control output terminal;*

*a sensing element having a first terminal coupled to said sensing input terminal of said control circuit and having a second terminal;*

*a solenoid drive switch having a control terminal coupled to said first control output terminal of said control circuit, said drive switch serially coupled to said sensing element, the series combination of said drive switch and said sensing element being coupled between said second terminal of said solenoid and said second supply terminal; and*

*a first variable voltage controller having first and second regulator terminals respectively coupled to said first and second terminals of said solenoid, said variable voltage controller having a control terminal coupled to said second control output terminal of said control circuit.*

*14. The device of claim 13, further comprising:*

*said control circuit having a third control output terminal; and*

*a second voltage controller having first and second regulator terminals respectively coupled to said first and second terminals of said solenoid, said second voltage controller having a control terminal coupled to said third output terminal of said control circuit.*

*15. The device of claim 13 wherein said control circuit comprises:*

*a maximum-hold-current reference terminal; and*

*a comparator having a first input terminal coupled to said sensing input terminal, a second input terminal coupled to said maximum-hold-current reference terminal, and an output terminal coupled to said second control output terminal.*

*16. The device of claim 13 wherein said first variable voltage controller comprises:*

*a plurality of diodes that are serially coupled between said first and second terminals of said solenoid, said diodes having their cathodes directed toward said second terminal of said solenoid; and*

*a switch having a control terminal coupled to said control terminal of said first voltage controller, said switch coupled in parallel with one or more of said diodes.*

*17. A device for driving an inductive load, comprising:*

*a drive switch coupled to said inductive load;*

*a first voltage regulator coupled to said inductive load; and*

*a control circuit coupled to said voltage regulator and to said drive switch, said control circuit being connected to receive an input signal, and in response to said input signal, said control circuit being operable to,*

*close said drive switch such that a charge current flows through said inductive load,*

*open said drive switch when said charge current rises to a peak level,*

*control said voltage regulator to adjust the voltage across said inductive load such that a discharge current that flows through said inductive load falls at a first rate,*

*detect when said discharge current falls to a first predetermined value, and*

*in response to said detection, control said voltage regulator to adjust said voltage across said inductive load so as to decrease the rate at which said discharge current falls.*

*18. The device of claim 17 wherein said control circuit is further operable to:*

*detect when said discharge current falls to a second predetermined value that is less than said first predetermined value; and*

*in response to said latter detection, control said switch such that a hold current flows through said inductive load.*

*19. The device of claim 17 wherein said control circuit is further operable:*

*to control said voltage regulator to limit said voltage across said inductive load to a first voltage level substantially immediately after opening said drive switch; and*

*in response to detecting said discharge current falling to said first predetermined value, to control said voltage regulator to reduce said voltage across said inductive load to a second voltage level that is less than said first voltage level.*

*20. The device of claim 17, further comprising:*

*a second voltage regulator coupled to said inductive load and said control circuit; and*

*in response to said discharge current falling to said second predetermined value, said control circuit operable to activate said second voltage regulator and alternately open and close said drive switch such that said hold current oscillates between said first and second current levels.*

*21. The device of claim 17, further comprising:*

*a regulator transistor having a control terminal coupled to said control circuit, said regulator transistor coupled across said inductive load; and*

*in response to said discharge current falling to said second predetermined value, said control circuit operable to activate said regulator transistor and alternately open and close said drive switch such that said hold current oscillates between said first and second current levels.*

*22. The device of claim 17 wherein said first voltage regulator comprises:*

*a plurality of serially connected reverse-biased diodes coupled across said inductive load; and*

*a switch having a control terminal coupled to said control circuit, said switch coupled across one or more of said diodes.*

*23. An inductive load drive circuit, comprising:*

*a switch series-connected to an inductive load, said load having first and second terminals;*

*a first current recirculating branch, having nodes connected to said first and second terminals of said load, for maintaining a predetermined load voltage and enabling a fall in load current at a first predetermined rate from a peak current;*

*a logic control unit responsive to said load current for opening and closing said switch and said branches, so that the load is supplied with current rising to said peak current, and then falling at said first predetermined rate and oscillating between said predetermined maximum hold current and a predetermined minimum hold current; and*

*means, connected to said first branch, for varying said predetermined load voltage supplied across the load to a lower predetermined load voltage when said load current reaches a predetermined amount from said peak current;*

*whereby said fall in load current from said peak current occurs at said first predetermined rate and is then slowed when said load current reaches said predetermined amount from said peak current.*

*24. The drive circuit of claim 23, further comprising a second current recirculating branch parallel-connected to the load, for enabling a fall in load current at a second predetermined rate from a predetermined maximum hold current.*

*25. A circuit as claimed in claim 23 wherein said first recirculating branch comprises a number of series-connected bias voltage elements, and said supplied voltage varying means comprise means for short-circuiting a predetermined subset of said bias voltage elements.*

*26. A circuit as claimed in claim 25 wherein said bias voltage elements comprise a plurality of series-connected Zener diodes, and said short-circuiting means comprise a transistor having emitter and collector terminals connected to said second terminal of the load and between a predetermined pair of connected Zener diodes, a base terminal of said transistor coupled to an output of a comparator having a first input connected to a reference voltage source, and a second input connected to a load current sensing element.*

*27. A circuit for driving an inductive load, said circuit comprising:*

*a switch connected in series with said inductive load between first and second reference potential lines;*

*a first recirculating branch having a first node connected to said first reference potential line, and a second node connected between said switch and said inductive load, said first branch providing a fall in current through said load after said current reaches a peak value;*

*a second recirculating branch connected between said switch and said first reference potential line in parallel with said inductive load, said second branch enabling a fall in current through said load;*

*a logic unit for controlling said switch and said branches so that said load is supplied with current rising to said peak value, and then falling to and oscillating about a lower hold value; and*

*means connected to said first branch for controlling said first branch so that said fall in current through said load is slowed after said current reaches a predetermined amount less than said peak value.*

*28. The circuit as in claim 27 wherein said first branch comprises a plurality of series-connected bias voltage elements for generating a predetermined bias voltage across said load to enable said fall in current through said load, and said controlling means for short-circuiting a subset of said bias voltage elements to decrease said bias voltage across said load when said current through said load reaches said predetermined amount less than said peak value so that said fall in current through said load is slowed after said current reaches said predetermined amount less than said peak value.*

*29. The circuit as in claim 28 wherein said bias voltage elements comprise Zener diodes connected in series, and wherein said short-circuiting means comprises a transistor having emitter and collector terminals connected between said load and said switch, and a predetermined pair of connected Zener diodes, a base terminal of said transistor connected to a second switch for turning on said transistor when said current through said load reaches said predetermined amount less than said peak value.*

*30. The circuit as in claim 27 wherein said first recirculating branch has a third node connected to said second reference potential line.*

*31. A circuit for driving an inductive load, said circuit comprising:*

*a switch connected in series with said inductive load between first and second reference potential lines;*

*a recirculating branch having a first node connected to said first reference potential line, and a second node connected between said switch and said inductive load, said branch providing a voltage across said load to*

*enable a fall in load current through said load after said current reaches a peak value;*

*means, responsive to said load current and connected to said switch and to said first reference potential line in parallel to said load, for controlling said switch so that said load current oscillates between first and second hold values after said current falls from said peak value; and*

*means, responsive to said controlling means and connected to said branch, for decreasing said voltage across said load when said current through said load reaches a predetermined value after said current falls from said peak value;*

*whereby said fall in current through said load is slowed when said current reaches said predetermined value from said peak value.*

*32. The circuit as in claim 31 wherein said branch comprises a plurality of series-connected bias voltage elements generating said voltage across said load and said voltage decreasing means comprises means for short-circuiting a subset of said bias voltage elements to decrease said voltage.*

*33. The circuit as in claim 31 wherein said bias voltage elements comprise Zener diodes connected in series and wherein said short-circuiting means comprises a transistor having emitter and collector terminals connected between said load and said switch, and between a predetermined pair of connected Zener diodes, a base terminal of said transistor connected to a second switch for turning on said transistor when said current through said load reaches said predetermined value.*

*34. The circuit as in claim 31 wherein said recirculating branch has a third node connected to said second reference potential line.*

*35. A method of driving an inductive load, comprising:*

*causing a charge current to flow through said inductive load;*

*allowing said inductive load to discharge when said charge current becomes equal to a peak value such that a discharge current that decreases at a first rate flows through said inductive load;*

*causing said discharge current to decrease at a second rate when said discharge current becomes equal to a first value, said second rate less than said first rate; and*

*causing a hold current to flow through said inductive load when said discharge current becomes equal to a second value that is less than said first value.*

*36. The method of claim 35 wherein said causing a hold current to flow through said inductive load comprises maintaining said hold current between said first and second values.*

*37. The method of claim 35 wherein said causing a hold current to flow through said inductive load comprises causing said hold current to oscillate between said first and second values.*

*38. A method of driving an inductive load, comprising:*

*coupling a first charge voltage across said inductive load such that a charge current flows through said inductive load;*

*uncoupling said charge voltage from across said inductive load when said charge current attains a peak level;*

*after said uncoupling, regulating a discharge voltage across said inductive load such that a discharge current flows through said inductive load, said discharge current decreasing at a first rate until said discharge current attains a first current level, said discharge current thereafter decreasing at a second rate that is less than said first rate; and*

*when said discharge current attains a second current level, alternately coupling a second charge voltage across said inductive load and regulating said discharge voltage such that a hold current, that is between said first and second current levels flows through said inductive load.*

*39. The method of claim 38 wherein said regulating comprises:*

*limiting said discharge voltage to a first voltage level until said discharge current attains said first current level; and*

*limiting said discharge voltage to a second voltage level that is less than said first voltage level when said discharge current attains said first current level.*

*40. The method of claim 38 wherein said first and second charge voltages are equivalent.*

*41. The method of claim 38 wherein said alternately coupling and regulating comprises alternately coupling said second charge voltage across said inductive load and regulating said discharge voltage such that said hold current oscillates between said first and second current levels.*

*42. The method of claim 38 wherein said regulating comprises:*

*coupling a first number of reverse-biased diodes across said inductive load until said discharge current attains said first current level; and*

*coupling a second number of reverse-biased diodes across said inductive load when said discharge current attains said first current level, said second number less than said first number.*

* * * * *